(12) United States Patent
Huang et al.

(10) Patent No.: US 10,319,274 B2
(45) Date of Patent: Jun. 11, 2019

(54) SHIFT REGISTER UNIT, DRIVING METHOD THEREOF, GATE DRIVING CIRCUIT AND DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Fei Huang, Beijing (CN); Jian Sun, Beijing (CN); Zhen Wang, Beijing (CN); Wenwen Qin, Beijing (CN); Xiaozhou Zhan, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/762,337

(22) PCT Filed: Oct. 12, 2017

(86) PCT No.: PCT/CN2017/105839
§ 371 (c)(1),
(2) Date: Mar. 22, 2018

(87) PCT Pub. No.: WO2018/161565
PCT Pub. Date: Sep. 13, 2018

(65) Prior Publication Data
US 2019/0073932 A1 Mar. 7, 2019

(30) Foreign Application Priority Data
Mar. 10, 2017 (CN) .......................... 2017 1 0141851

(51) Int. Cl.
*G09G 3/36* (2006.01)
*G11C 19/28* (2006.01)
(Continued)

(52) U.S. Cl.
CPC ............. *G09G 3/20* (2013.01); *G09G 3/3266* (2013.01); *G09G 3/3666* (2013.01); *G11C 19/28* (2013.01);
(Continued)

(58) Field of Classification Search
CPC ...... G09G 3/20; G09G 3/3266; G09G 3/3674; G09G 3/3677; G09G 2300/0408; G09G 2310/0286; G11C 19/28; G11C 19/287
See application file for complete search history.

(56) References Cited

U.S. PATENT DOCUMENTS 7,215,315 B2   5/2007   Morosawa et al.
7,250,788 B2   7/2007   Lee et al.
(Continued)

FOREIGN PATENT DOCUMENTS

CN   1755765 A   4/2006
CN   1832048 A   9/2006
(Continued)

OTHER PUBLICATIONS

English translation of International Search Report dated Jan. 18, 2018, issued in counterpart International Application No. PCT/CN2017/105839 (13 pages).

*Primary Examiner* — Patrick O Neill
(74) *Attorney, Agent, or Firm* — Westerman, Hattori, Daniels & Adrian, LLP

(57) ABSTRACT

A shift register unit includes an input circuit, an output circuit, a pull-down control circuit, and a pull-down circuit. The pull-down control circuit is coupled to a first power supply signal terminal, a second power supply signal termi-
(Continued)

nal, a pull-up node, a pull-down node, and a reset signal terminal. The pull-down control circuit is configured to transmit a first power supply signal from the first power supply signal terminal to the pull-down node under a control of the first power supply signal, transmit the first power supply signal from the first power supply signal terminal to the pull-down node under a control of the reset signal, and transmit a second power supply signal from the second power supply signal terminal to the pull-down node under a control of the pull-up node.

20 Claims, 6 Drawing Sheets

(51) Int. Cl.
  *G09G 3/20* (2006.01)
  *G09G 3/3266* (2016.01)
(52) U.S. Cl.
  CPC .............. *G09G 2300/0408* (2013.01); *G09G 2310/0286* (2013.01); *G09G 2310/06* (2013.01)

(56) References Cited

U.S. PATENT DOCUMENTS

| | | | | |
|---|---|---|---|---|
| 8,548,115 | B2* | 10/2013 | Shang | .................. G09G 3/3677 |
| | | | | 377/64 |
| 8,923,473 | B2* | 12/2014 | Sasaki | .................. G09G 3/3677 |
| | | | | 377/64 |
| 9,570,025 | B2* | 2/2017 | Liu | ...................... G09G 3/3674 |
| 9,640,276 | B2 | 5/2017 | Li et al. | |
| 9,715,860 | B2* | 7/2017 | Yang | ...................... G11C 19/28 |
| 9,766,741 | B2* | 9/2017 | Zhao | .................... G09G 3/3677 |
| 10,121,436 | B2* | 11/2018 | Huang | ...................... G09G 3/36 |
| 2016/0172054 | A1 | 6/2016 | Shao et al. | |
| 2017/0039971 | A1 | 2/2017 | Huang | |

FOREIGN PATENT DOCUMENTS

| | | |
|---|---|---|
| CN | 103226981 A | 7/2013 |
| CN | 104392704 A | 3/2015 |
| CN | 104700805 A | 6/2015 |
| CN | 106409207 A | 2/2017 |
| JP | 2009288562 A | 12/2009 |
| JP | 2016118663 A | 6/2016 |

* cited by examiner

SHIFT REGISTER UNIT, DRIVING METHOD THEREOF, GATE DRIVING CIRCUIT AND DISPLAY DEVICE

CROSS-REFERENCE TO RELATED APPLICATION

This PCT patent application claims priority to Chinese Patent Application No. 201710141851.1, filed on Mar. 10, 2017, the entire contents of which are incorporated herein by reference.

TECHNICAL FIELD

The present disclosure generally relates to the field of display technologies and more particularly, to a shift register unit, a driving method thereof, a gate driving circuit, and a display device.

BACKGROUND

When a display device displays an image, pixel units need to be scanned using shift register, i.e., a gate driving circuit. The shift register includes a plurality of cascaded shift register units, and each shift register unit corresponds to one row of pixel units. The progressive scanning and driving on each row of pixel units in the display device is realized by the plurality of cascaded shift register units, for displaying an image.

A conventional shift register unit usually includes an input module, i.e., an input circuit, an output module, i.e., an output circuit, and a noise reduction module, i.e., a noise reduction circuit. The input module is for inputting an electric potential of an output terminal of an upper-one-stage shift register unit to a pull-up node, to pull up the electric potential of the pull-up node. The output module is for outputting a driving signal to an output terminal under the control of the pull-up node. The noise reduction module is for pulling down the electric potential of the pull-up node and the output terminal under the control of a clock signal, thereby realizing noise reduction at the pull-up node and the output terminal.

However, because the noise reduction module is controlled by the clock signal, when the clock signal is at a low level, transistors in the noise reduction module cannot be effectively turned on. Accordingly, noise exists at the pull-up node and the output terminal in the conventional shift register unit.

SUMMARY

In one aspect, the present disclosure provides a shift register unit. The shift register unit includes an input circuit, an output circuit, a pull-down control circuit, and a pull-down circuit. The input circuit is coupled to an input signal terminal, a reset signal terminal, a first control signal terminal, a second control signal terminal, and a pull-up node. The input circuit is configured to control an electric potential of the pull-up node, under a control of an input signal from the input signal terminal, a reset signal from the reset signal terminal, a first control signal from the first control signal terminal, and a second control signal from the second control signal terminal. The output circuit is coupled to a first clock signal terminal, the pull-up node, and an output terminal. The output circuit is configured to transmit a first clock signal from the first clock signal terminal to the output terminal under a control of the pull-up node. The pull-down control circuit is coupled to a first power supply signal terminal, a second power supply signal terminal, the pull-up node, a pull-down node, and the reset signal terminal. The pull-down control circuit is configured to transmit a first power supply signal from the first power supply signal terminal to the pull-down node under a control of the first power supply signal, transmit the first power supply signal from the first power supply signal terminal to the pull-down node under a control of the reset signal, and transmit a second power supply signal from the second power supply signal terminal to the pull-down node under a control of the pull-up node. The first power supply signal is at a first electric potential, and the second power supply signal is at a second electric potential. The pull-down circuit is coupled to the pull-down node, the second power supply signal terminal, the pull-up node, and the output terminal. The pull-down circuit is configured to transmit the second power supply signal to the pull-up node and the output terminal under a control of the pull-down node.

Another aspect of the present disclosure provides a method for driving a shift register unit. The method includes providing an input signal at an input signal terminal to cause an input circuit to transmit a first control signal from a first control signal terminal to a pull-up node, where the input signal and the first control signal are at a first electric potential; providing a first clock signal at a first clock signal terminal and holding the pull-up node at the first electric potential, to cause an output circuit to transmit the first clock signal from the first clock signal terminal to an output terminal, where the first clock signal is at the first electric potential; providing a reset signal at a reset signal terminal to cause the input circuit to transmit a second control signal from a second control signal terminal to the pull-up node and to cause a pull-down control circuit to transmit a first power supply signal from a first power supply signal terminal to a pull-down node, where the reset signal is at the first electric potential and the second control signal is at a second electric potential; and providing the first power supply signal at a first power supply signal terminal to cause the pull-down control circuit to transmit the first power supply signal to the pull-down node, and to cause a pull-down circuit to transmit a second power supply signal from a second power supply signal terminal to the pull-up node and the output terminal, where the first power supply signal is at the first electric potential and the second power supply signal is at the second electric potential.

BRIEF DESCRIPTION OF THE FIGURES

The following drawings are merely examples for illustrative purposes according to various disclosed embodiments and are not intended to limit the scope of the present disclosure.

DETAILED DESCRIPTION

Exemplary embodiments of the disclosure will now be described in more detail with reference to the drawings. It is to be noted that, the following descriptions of some embodiments are presented herein for purposes of illustration and description only, and are not intended to be exhaustive or to limit the scope of the present disclosure.

The aspects and features of the present disclosure can be understood by those skilled in the art through the exemplary embodiments of the present disclosure further described in detail with reference to the accompanying drawings.

In some embodiments, transistors described in this disclosure can be thin film transistors, field-effect transistors, or other suitable devices having same or similar characteristics. In some embodiments, the transistors can be switching transistors according to the functions of the transistors in the circuit. In some embodiments, for the switching transistors in which the source electrode and drain electrode are symmetrical to each other, the source electrode and drain electrode can be interchangeable. In some embodiments, the source electrode can be referred to as a first electrode, and the drain electrode can be referred to as a second electrode. In various accompanying figures, a middle terminal of the transistor can be a gate electrode, a signal input terminal can be the source electrode, and a signal output terminal can be the drain electrode.

In addition, in some embodiments, the switching transistor may include any one of a P-type switching transistor or an N-type switching transistor. The P-type switching transistor may be turned on when the gate electrode is at a low level, and may be turned off when the gate electrode is at a high level. The N-type switching transistor may be turned on when the gate electrode is at a high level, and may be turned off when the gate electrode is at a low level. In addition, in some embodiments, a plurality of signals may correspond to a first electric potential and a second electric potential. The first electric potential and the second electric potential merely represent two states for the electric potential of the signal, and do not represent that the first electric potential or the second electric potential has a given value.

Multiple shift register units according to the present disclosure can be cascaded to form a shift register. Each shift register unit may constitute one stage of the shift register and may be coupled to two other shift register units. One of the two other shift register units is one stage before the current shift register unit and is referred to an upper-one-stage shift register unit. The other one of the two other shift register units is one stage behind the current shift register unit and is referred to as a lower-one-stage shift register unit.

Figure 1:
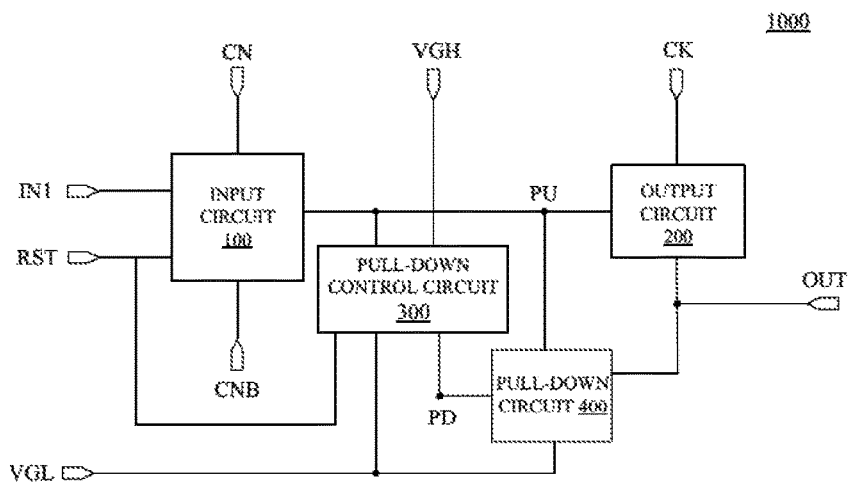
FIG. 1 illustrates a schematic view of an exemplary shift register unit according to various disclosed embodiments of the present disclosure.

FIG. 1 illustrates a schematic view of an exemplary shift register unit 1000 according to various disclosed embodiments of the present disclosure. As shown in FIG. 1, the shift register unit 1000 includes an input module 100, i.e., an input circuit 100, an output module 200, i.e., an output circuit 200, a pull-down control module 300, i.e., a pull-down control circuit 300, and a pull-down module 400, i.e., a pull-down circuit 400. Each of the modules described in this disclosure can include a circuit including one or more electronic components, such as one or more transistors. The shift register unit 1000 also includes an input signal terminal IN1, a reset signal terminal RST, a first control signal terminal CN, a second control signal terminal CNB, a first clock signal terminal CK, a pull-up node PU, an output terminal OUT, a first power supply signal terminal VGH, a second power supply signal terminal VGL, and a pull-down node PD. The input signal terminal IN1 can be coupled to an output terminal of an upper-one-stage shift register unit and the reset signal terminal RST can be coupled to an output terminal of a lower-one-stage shift register unit.

As shown in FIG. 1, the input module 100 is coupled to the input signal terminal IN1, the reset signal terminal RST, the first control signal terminal CN, the second control signal terminal CNB, and the pull-up node PU, for controlling the electric potential of the pull-up node PU under the control of an input signal from the input signal terminal IN1, a reset signal from the reset signal terminal RST, a first control signal from the first control signal terminal CN, and a second control signal from the second control signal terminal CNB.

The output module 200 is coupled to the first clock signal terminal CK, the pull-up node PU, and the output terminal OUT, for transmitting a first clock signal from the first clock signal terminal CK to the output terminal OUT under the control of the pull-up node PU.

The pull-down control module 300 is coupled to the reset signal terminal RST, the first power supply signal terminal VGH, the second power supply signal terminal VGL, the pull-up node PU, and the pull-down node PD. The pull-down control module 300 can be controlled by a first power supply signal from the first power supply signal terminal VGH to transmit the first power supply signal to the pull-down node PD. Further, the pull-down control module 300 can be controlled by the pull-up node PU to transmit a second power supply signal from the second power supply signal terminal VGL to the pull-down node PD. The first power supply signal may be the first electric potential, and the second power supply signal may be the second electric potential. In some embodiments, the first power supply signal can be a direct current (DC) high level signal, and the second power supply signal can be a DC low level signal.

The pull-down module 400 is coupled to the pull-down node PD, the second power supply signal terminal VGL, the pull-up node PU, and the output terminal OUT, for transmitting the second power supply signal to the pull-up node PU and the output terminal OUT, under the control of the pull-down node PD.

Accordingly, the present disclosure provides a shift register unit. In some embodiments, a pull-down control module of the shift register unit may be coupled to a first power supply signal terminal, and may transmit a first power supply signal to a pull-down node under the control of the first power supply signal terminal. Because the electric potential of the first power supply signal can be maintained at the first electric potential, the electric potential of the pull-down node can be kept stable, ensuring that the pull-down module can reduce noise at the pull-up node and the output terminal continuously under the control of the pull-down node. Accordingly, the noise reduction performance of the pull-down module can be improved.

Figure 2:
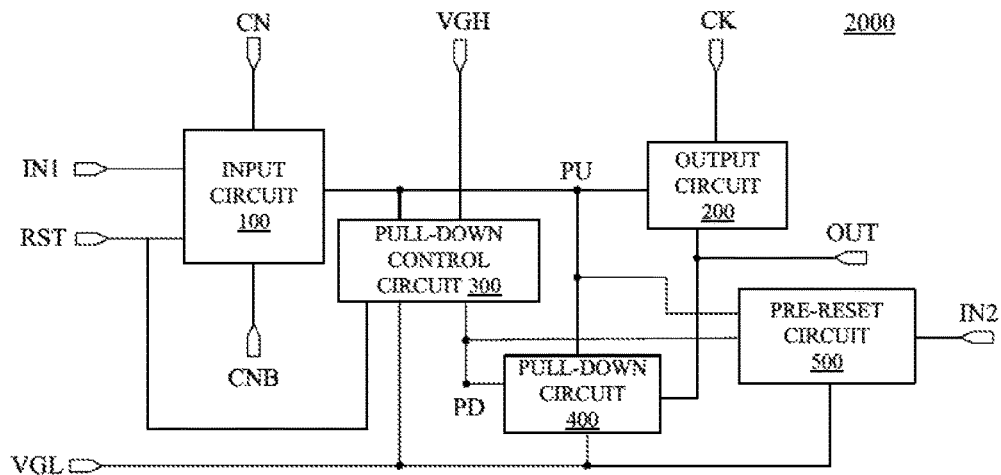
FIG. 2 illustrates a schematic view of another exemplary shift register unit according to various disclosed embodiments of the present disclosure.

FIG. 2 illustrates a schematic view of another exemplary shift register unit 2000 according to various disclosed embodiments of the present disclosure. The similar aspects between FIG. 2 and FIG. 1 are not repeated, while certain different aspects are explained. Different from the shift register unit 1000 shown in FIG. 1, the shift register unit 2000 shown in FIG. 2 further includes a pre-reset module 500, i.e., a pre-reset circuit 500, and a pre-reset signal terminal IN2. The pre-reset signal terminal IN2 can be coupled to an input signal terminal of the upper-one-stage shift register unit.

The pre-reset module 500 is coupled to the pre-reset signal terminal IN2, the second power supply signal terminal VGL, the pull-up node PU, and the pull-down node PD. The pre-reset module 500 can be controlled by a pre-reset signal from the pre-reset signal terminal IN2 to transmit a second power supply signal to the pull-up node PU and transmit the pre-reset signal to the pull-down node PD.

In some embodiments, when an input signal at the input signal terminal of the upper-one-stage shift register unit is at an effective electric potential, i.e., when the input signal is at the first electric potential, in other words, when the upper-one-stage shift register unit starts to operate, the pre-reset module 500 may pull up the electric potential of the pull-down node PD in the current-stage shift register unit, i.e., the shift register unit 2000, to the first electric potential, under the control of the pre-reset signal terminal IN2. Accordingly, the pull-down module 400 can reduce noise at the pull-up node PU and the output terminal OUT, and can reset the pull-up node PU and the output terminal OUT, under the control of the pull-down node PD, thereby preparing for the subsequent signal input.

Figure 3:
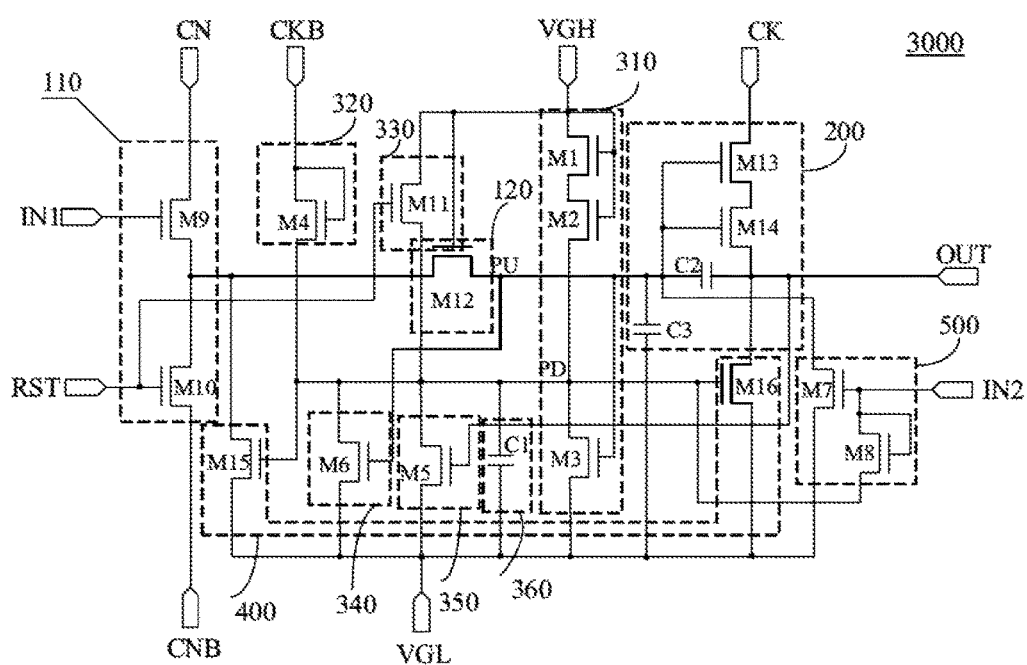
FIG. 3 illustrates a schematic view of another exemplary shift register unit according to various disclosed embodiments of the present disclosure.

FIG. 3 illustrates a schematic view of another exemplary shift register unit 3000 according to various disclosed embodiments of the present disclosure. The similar aspects between FIG. 3 and FIG. 2 are not repeated, while certain different aspects are explained. As shown in FIG. 3, the pull-down control module 300 of the shift register unit 3000 includes a first pull-down control sub-module 310, i.e., a first pull-down control sub-circuit 310, a second pull-down control sub-module 320, i.e., a second pull-down control sub-circuit 320, a third pull-down control sub-module 330, i.e., a third pull-down control sub-circuit 330, a fourth pull-down control sub-module 340, i.e., a fourth pull-down control sub-circuit 340, a fifth pull-down control sub-module 350, i.e., a fifth pull-down control sub-circuit 350, and a sixth pull-down control sub-module 360, i.e., a sixth pull-down control sub-circuit 360. The first pull-down control sub-circuit 310 includes a first transistor M1, a second transistor M2, and a third transistor M3.

The gate electrode and the first electrode of the first transistor M1 are coupled to the first power supply signal terminal VGH. The second electrode of the first transistor M1 is coupled to the first electrode of the second transistor M2. The gate electrode of the second transistor M2 is coupled to the first power supply signal terminal VGH. The second electrode of the second transistor M2 is coupled to the pull-down node PD.

The gate electrode of the third transistor M3 is coupled to the pull-up node PU, the first electrode of the third transistor M3 is coupled to the second power supply signal terminal VGL, and the second electrode of the third transistor M3 is coupled to the pull-down node PD.

The first transistor M1 and the second transistor M2 are arranged and coupled in series, and together form an equivalent transistor. The channel of the equivalent transistor has a relatively long channel length, such that the leakage current of the first transistor M1 and the second transistor M2 may be reduced. The reduction of the leakage current of the first transistor M1 and the second transistor M2 not only can reduce a power consumption of the shift register unit 3000, but also can prevent the transistors from overheating and performance degradation, thereby ensuring the stability of the shift register unit 3000 during operation.

Further, as shown in FIG. 3, the pull-down control module 300 is also coupled to a second clock signal terminal CKB and the output terminal OUT. The second pull-down control sub-circuit 320 of the pull-down control module 300 includes a fourth transistor M4. The third pull-down control sub-circuit 330 includes an eleventh transistor M11. The fourth pull-down control sub-circuit 340 includes a sixth transistor M6. The fifth pull-down control sub-circuit 350 includes a fifth transistor M5. The sixth pull-down control sub-circuit 360 includes a first capacitor C1.

The gate electrode and the first electrode of the fourth transistor M4 is coupled to the second clock signal terminal CKB. The second electrode of the fourth transistor M4 is coupled to the pull-down node PD. When a second clock signal transmitted from the second clock signal terminal CKB is at the first electric potential, the fourth transistor M4 can transmit the second clock signal to the pull-down node PD, such that the electric potential of the pull-down node PD can be pulled up.

The gate electrode of the fifth transistor M5 is coupled to the output terminal OUT, the first electrode of the fifth transistor M5 is coupled to the second power supply signal terminal VGL, and the second electrode of the fifth transistor M5 is coupled to the pull-down node PD. When the electric potential of the output terminal OUT is the first electric potential, the fifth transistor M5 transmits the second power supply signal to the pull-down node PD, such that the electric potential of the pull-down node PD can be pulled down.

The gate electrode of the sixth transistor M6 is coupled to the pull-up node PU, the first electrode of the sixth transistor M6 is coupled to the second power supply signal terminal VGL, and the second electrode of the sixth transistor M6 is coupled to the pull-down node PD. When the electric potential of the pull-up node PU is the first electric potential, the sixth transistor M6 transmits the second power supply signal to the pull-down node PD, such that the electric potential of the pull-down node PD can be pulled down.

A first end of the first capacitor C1 is coupled to the second power supply signal terminal VGL and a second end of the first capacitor C1 is coupled to the pull-down node PD. The first capacitor C1 is used for stabilizing the electric potential of the pull-down node PD.

Further, as shown in FIG. 3, the third pull-down control sub-circuit 330 is also coupled to the first power supply signal terminal VGH and the pull-down node PD.

The gate electrode of the eleventh transistor M11 is coupled to the reset signal terminal RST, the first electrode of the eleventh transistor M11 is coupled to the first power supply signal terminal VGH, and the second electrode of the eleventh transistor M11 is coupled to the pull-down node PD. When the reset signal is at the first electric potential, the eleventh transistor M11 of the third pull-down control sub-circuit 330 can be turned on, and the first power supply signal terminal VGH can provide the first power supply signal to the pull-down node PD. Accordingly, the electric potential of the pull-down node PD can be pulled up, such that the pull-down module 400 may start to operate, and perform noise reduction at the pull-up node PU and the output terminal OUT.

In some embodiments, as shown in FIG. 3, the pre-reset module 500 includes a seventh transistor M7 and an eighth transistor M8.

The gate electrode of the seventh transistor M7 is coupled to the pre-reset signal terminal IN2, the first electrode of the seventh transistor M7 is coupled to the second power supply signal terminal VGL, and the second electrode of the seventh transistor M7 is coupled to the pull-up node PU. When the pre-reset signal is at the first electric potential, the seventh transistor M7 transmits the second power supply signal to the pull-up node PU, such that the electric potential of the pull-up node PU can be pulled down.

The gate electrode and the first electrode of the eighth transistor M8 are coupled to the pre-reset signal terminal IN2, and the second electrode of the eighth transistor M8 is coupled to the pull-down node PD. When the pre-reset signal is at the first electric potential, the eighth transistor M8 may be used for transmitting the pre-reset signal to the pull-down node PD, such that the electric potential of the pull-down node PD can be pulled up.

In some embodiments, as shown in FIG. 3, the input module 100 includes a first input sub-module 110, i.e., a first input sub-circuit 110, and a second input sub-module 120, i.e., a second input sub-circuit 120. The first input sub-circuit 110 includes a ninth transistor M9 and a tenth transistor M10.

The gate electrode of the ninth transistor M9 is coupled to the input signal terminal IN1, the first electrode of the ninth transistor M9 is coupled to the first control signal terminal CN, and the second electrode of the ninth transistor M9 is coupled to the pull-up node PU.

The gate electrode of the tenth transistor M10 is coupled to the reset signal terminal RST, the first electrode of the tenth transistor M10 is coupled to the second control signal terminal CNB, and the second electrode of the tenth transistor M10 is coupled to the pull-up node PU.

Further, as shown in FIG. 3, the second input sub-circuit 120 of the input module 100 is coupled to the first power supply signal terminal VGH, and the second input sub-circuit 120 of the input module 100 includes a twelfth transistor M12.

The gate electrode of the twelfth transistor M12 is coupled to the first power supply signal terminal VGH, the first electrode of the twelfth transistor M12 is coupled to the second electrode of the ninth transistor M9 and the second electrode of the tenth transistor M10, and the second electrode of the twelfth transistor M12 is coupled to the pull-up node PU.

The gate electrode of the twelfth transistor M12 is coupled to the first power supply signal terminal VGH, and the electric potential of the first power supply signal may be the first electric potential. Thus, the twelfth transistor M12 can be continuously on. Accordingly, the gate electrode and the source/drain electrodes of the twelfth transistor M12 can be equivalent to a capacitor, filtering out noise in the shift register unit 3000.

In some embodiments, as shown in FIG. 3, the output module 200 includes a thirteenth transistor M13, a fourteenth transistor M14, and a second capacitor C2.

The gate electrode of the thirteenth transistor M13 is coupled to the pull-up node PU, the first electrode of the thirteenth transistor M13 is coupled to the first clock signal terminal CK, and the second electrode of the thirteenth transistor M13 is coupled to the first electrode of the fourteenth transistor M14.

The gate electrode of the fourteenth transistor M14 is coupled to the pull-up node PU, and the second electrode of the fourteenth transistor M14 is coupled to the output terminal OUT.

A first end of the second capacitor C2 is coupled to the pull-up node PU, and a second end of the second capacitor C2 is coupled to the output terminal OUT.

The thirteenth transistor M13 and the fourteenth transistor M14 are arranged and coupled in series, thereby reducing the leakage current of the thirteenth transistor M13 and the fourteenth transistor M14. As a result, the power consumption of the shift register unit 3000 can be reduced, and also the transistor can be prevented from overheating and performance degradation. Thus, the stability of the shift register unit 3000 during operation can be ensured.

Further, as shown in FIG. 3, the output module 200 further includes a third capacitor C3.

A first end of the third capacitor C3 is coupled to the second power supply signal terminal VGL, and a second end of the third capacitor C3 is coupled to the pull-up node PU. The third capacitor C3 may stabilize the electric potential of the pull-up node PU, and also filter out the noise in the circuit.

In some embodiments, as shown in FIG. 3, the pull-down module 400 includes a fifteenth transistor M15 and a sixteenth transistor M16.

The gate electrode of the fifteenth transistor M15 is coupled to the pull-down node PD, the first electrode of the fifteenth transistor M15 is coupled to the second power supply signal terminal VGL, and the second electrode of the fifteenth transistor M16 is coupled to the pull-up node PU.

The gate electrode of the sixteenth transistor M16 is coupled to the pull-down node PD, the first electrode of the sixteenth transistor M16 is coupled to the second power supply signal terminal VGL, and the second electrode of the sixteenth transistor M16 is coupled to the output terminal OUT.

The present disclosure provides a shift register unit. In some embodiments, the shift register unit may include a pull-down control module coupled to a first power supply signal terminal, and may transmit a first power supply signal to a pull-down node under the control of the first power supply signal terminal. Because the electric potential of the first power supply signal can remain at the first electric potential continuously, the electric potential of the pull-down node can be kept stable, ensuring that the pull-down module can continuously reduce the noise at the pull-up node and the output terminal under the control of the pull-down node. Accordingly, the noise reduction performance of the pull-down module can be improved. In addition, the shift register unit may further include a pre-reset module. The pre-reset module may reset the shift register unit before the shift register unit starts to operate, preventing the presence of an indeterminate state in the circuit. Accordingly, the stability of the shift register unit during operation can be improved, thereby improving the stability and yield of the corresponding display device.

Figure 4:
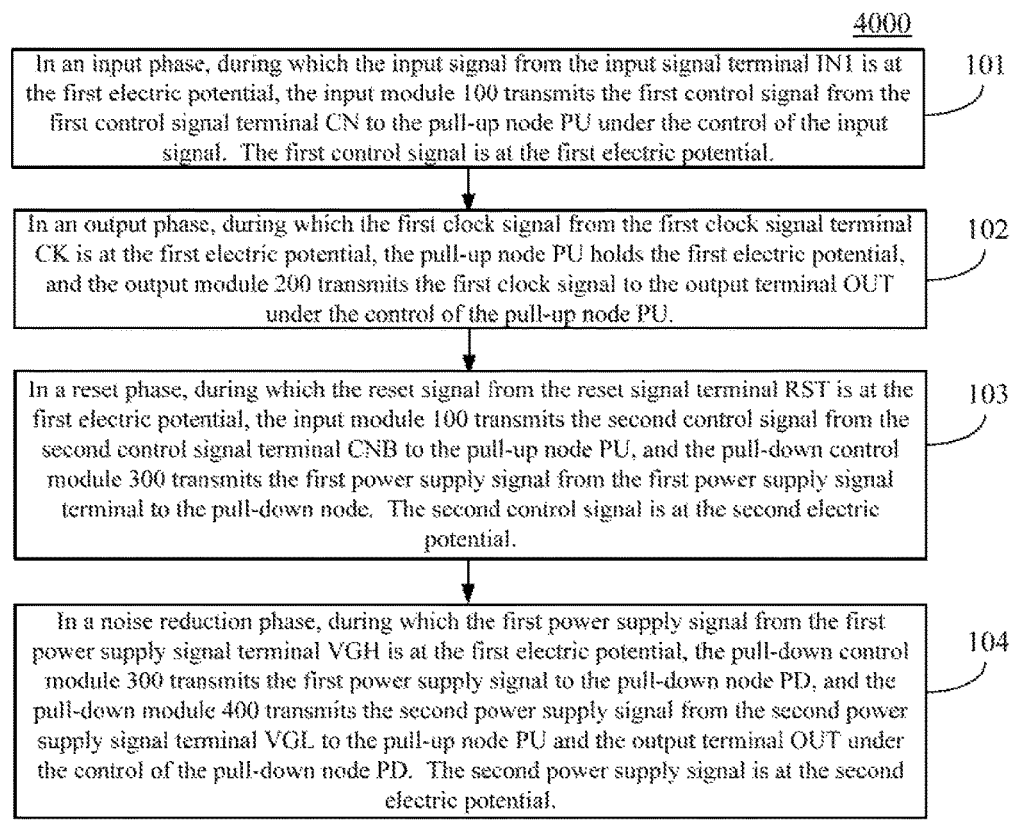
FIG. 4 illustrates a flow chart of an exemplary driving method for an exemplary shift register unit according to various disclosed embodiments of the present disclosure.

FIG. 4 illustrates a flow chart of an exemplary driving method 4000 for an exemplary shift register unit according to various disclosed embodiments of the present disclosure. The exemplary driving method 4000 can be used for driving a shift register unit, such as one of the shift register units discussed above in connection with FIGS. 1 to 3. The exemplary driving method 4000 will be described in detail with reference to FIG. 4.

At 101, in an input phase, during which the input signal from the input signal terminal IN1 is at the first electric potential, the input module 100 transmits the first control signal from the first control signal terminal CN to the pull-up node PU under the control of the input signal. The first control signal is at the first electric potential.

At 102, in an output phase, during which the first clock signal from the first clock signal terminal CK is at the first electric potential, the pull-up node PU holds the first electric potential, and the output module 200 transmits the first clock signal to the output terminal OUT under the control of the pull-up node PU.

At 103, in a reset phase, during which the reset signal from the reset signal terminal RST is at the first electric potential, the input module 100 transmits the second control signal from the second control signal terminal CNB to the pull-up node PU, and the pull-down control module 300 transmits the first power supply signal from the first power supply signal terminal to the pull-down node PD. The second control signal is at the second electric potential.

At 104, in a noise reduction phase, during which the first power supply signal from the first power supply signal terminal VGH is at the first electric potential, the pull-down control module 300 transmits the first power supply signal to the pull-down node PD, and the pull-down module 400 transmits the second power supply signal tram the second power supply signal terminal VGL to the pull-up node PU and the output terminal OUT under the control of the pull-down node PD. The second power supply signal is at the second electric potential.

Accordingly, the present disclosure provides a driving method for a shift register unit. In some embodiments, in the noise reduction phase of the driving method, because the first power supply signal can remain at the first electric potential continuously, the pull-down control module can hold the electric potential of the pull-down node at the first electric potential. Thus, the pull-down module can perform noise reduction at the pull-up node and the output terminal continuously under the control of the pull-down node, thereby effectively reducing the noise in the shift register unit.

In some embodiments, prior to the input phase, the method may further include a pre-reset phase. In the pre-reset phase, during which the pre-reset signal from the pre-reset signal terminal IN2 is at the first electric potential, the pre-reset module 500 may transmit the second power supply signal to the pull-up node PU and transmit the pre-reset signal to the pull-down node PD, and the pull-down module 400 may transmit a second power supply signal to the pull-up node PU and the output terminal OUT under the control of the pull-down node PD, to reset the pull-up node PU and the output terminal OUT.

Figure 5:
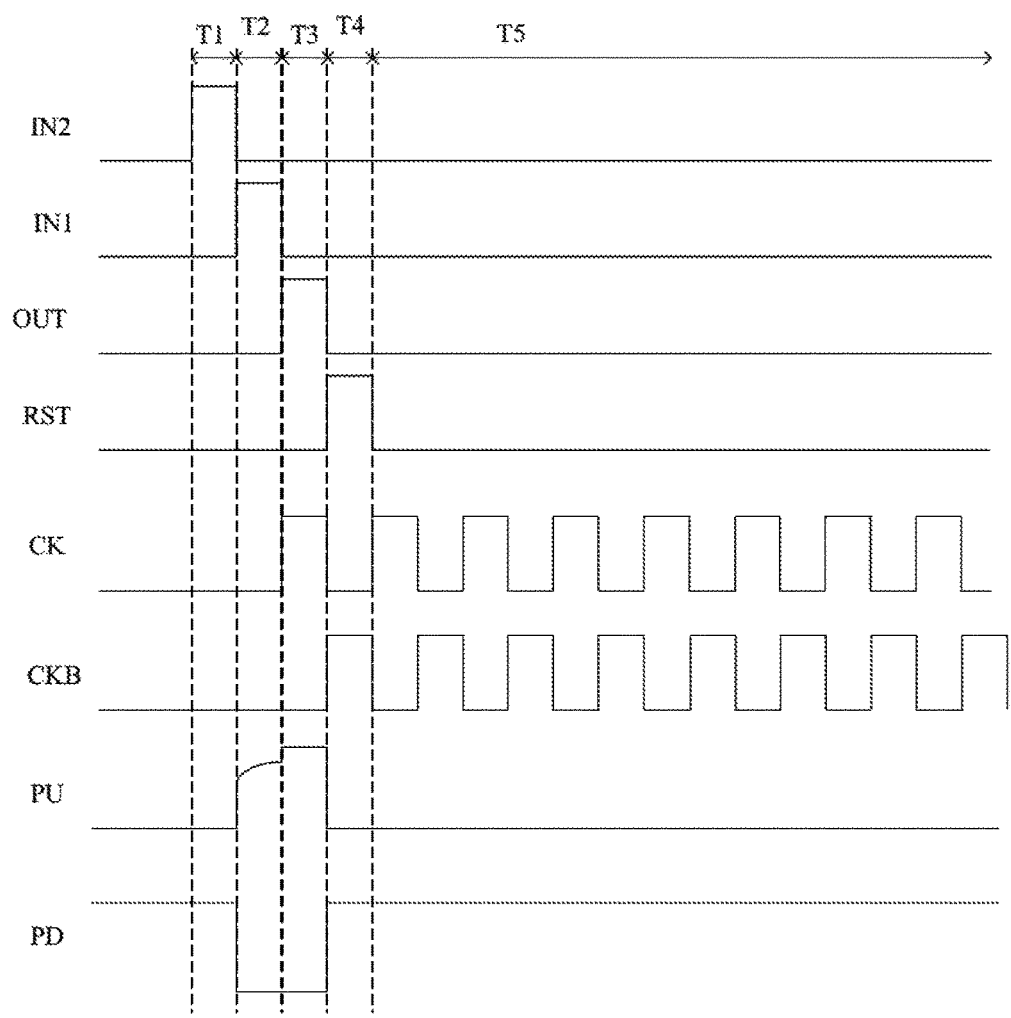
FIG. 5 illustrates an exemplary driving scheme of an exemplary shift register unit according to various disclosed embodiments of the present disclosure.

FIG. 5 illustrates an exemplary driving scheme of an exemplary shift register unit according to various disclosed embodiments of the present disclosure. The driving principles of the disclosed shift register unit will be described in detail with reference to the shift register unit shown in FIG. 3.

As shown in FIG. 5, in the pre-reset phase T1, the pre-reset signal from the pre-reset signal terminal IN2, which is coupled to the input signal terminal of the upper-one-stage shift register unit, is at the first electric potential. The seventh transistor M7 and the eighth transistor M8 are turned on. Thus, the second power supply signal terminal VGL transmits the second power supply signal to the pull-up node PU through the seventh transistor M7, and the pre-reset signal terminal IN2 transmits the pre-reset signal to the pull-down node PD through the eighth transistor M8 such that the electric potential of the pull-down node PD is the first electric potential. The fifteenth transistor M15 and the sixteenth transistor M16 in the pull-down module 400 are turned on under the control of the pull-down node PD. The second power supply signal terminal VGL transmits the second power source signal at the second electric potential to the pull-up node PU and the output terminal OUT, thereby performing the noise reduction at the pull-up node PU and the output terminal OUT, and preventing the presence of an indeterminate state in the circuit from influencing the subsequent normal operation.

In the input phase T2, the input signal from the input signal terminal IN1 is at the first electric potential and hence the ninth transistor M9 is turned on. That is, the input signal terminal IN1 controls the ninth transistor M9 to transmit the first control signal from the first control signal terminal CN to the pull-up node PU. The first control signal is at the first electric potential. As a result, the second capacitor C2 and the third capacitor C3 are charged, such that the electric potential of the pull-up node PU is pulled up. The high electric potential at the pull-up node PU causes the third transistor M3 and the sixth transistor M6 to turn on, such that the second power supply signal terminal VGL transmits the second power supply signal to the pull-down node PD, and the electric potential of the pull-down node PD is pulled down.

In the output phase T3, the first clock signal from the first clock signal terminal CK is at the first electric potential, and the electric potential of the pull-up node PU is further pulled up by the bootstrapping of the second capacitor C2. The thirteenth transistor M13 and the fourteenth transistor M14 are turned on, and the first clock signal terminal CK transmits the first clock signal, which is at the first electric potential, to the output terminal OUT. Correspondingly, the third transistor M3, the fifth transistor M5, and the sixth transistor M6 in the pull-down control module 300 are turned on, and the second power supply signal terminal VGL continues to transmit the second power supply signal to the pull-down node PD, causing the pull-down node PD to maintain the second electric potential. As a result, the fifteenth transistor M15 and the sixteenth transistor M16 are turned off, ensuring the stability of the signal outputted from the output terminal OUT.

In the reset phase T4, the reset signal from the reset signal terminal RST is at the first electric potential, causing the tenth transistor M10 and the eleventh transistor M11 to be turned on. Thus, the second control signal terminal CNB transmits the second control signal, which is at the second electric potential, to the pull-up node PU, thereby resetting the pull-up node PU. Meanwhile, the first power supply signal terminal VGH transmits the first power supply signal, which is at the first electric potential, to the pull-down node PD via the eleventh transistor M11, such that the pull-down module 400 resets the pull-up node PU and the output terminal OUT under the influence of the pull-down node PD.

Further, in the noise reduction phase T5, the first power supply signal from the first power supply signal terminal VGH is at the first electric potential, and the first transistor M1 and the second transistor M2 in the pull-down control module 300 are in a constantly-on state. Accordingly, the first power supply signal terminal VGH can continuously provide the first power supply signal to the pull-down node PD, and the pull-down module 400 continuously performs noise reduction at the pull-up node PU and the output terminal OUT under the control of the pull-down node PD, until the scan for a next image frame starts, i.e., until the input signal terminal IN1 provides an input signal at the first electric potential again.

In addition, as shown in FIG. 5, in the noise reduction phase T5, when the second clock signal from the second clock signal terminal CKB is at the first electric potential, the fourth transistor M4 is turned on and can also transmit the second clock signal at the first electric potential to the pull-down node PD for charging the pull-down node PD. Further, the first capacitor C1 of the pull-down control module 300 can store electric charges to ensure the stability of the electric potential of the pull-down node PD.

In the some embodiments, such as the exemplary embodiments described above, the first to sixteenth transistors may be N-type transistors, and the first electric potential may be higher than the second electric potential. In some other embodiments, the first to sixteenth transistors may be P-type transistors and, correspondingly, the first electric potential may be lower than the second electric potential. In these embodiments, the electric potential change at each signal terminal may be opposite to the electric potential change shown in FIG. 5. In other words, the phase difference between the two may be 180 degrees.

The present disclosure provides a driving method of a shift register unit. In some embodiments, in the noise reduction phase of the driving method, because the first power supply signal may remain at the first electric potential continuously, the pull-down control module may cause the electric potential of the pull-down node to remain at the first electric potential. Accordingly, the pull-down module may continuously perform noise reduction at the pull-up node and the output terminal under the control of the pull-down node, thereby effectively reducing the noise in the shift register unit.

Figure 6:
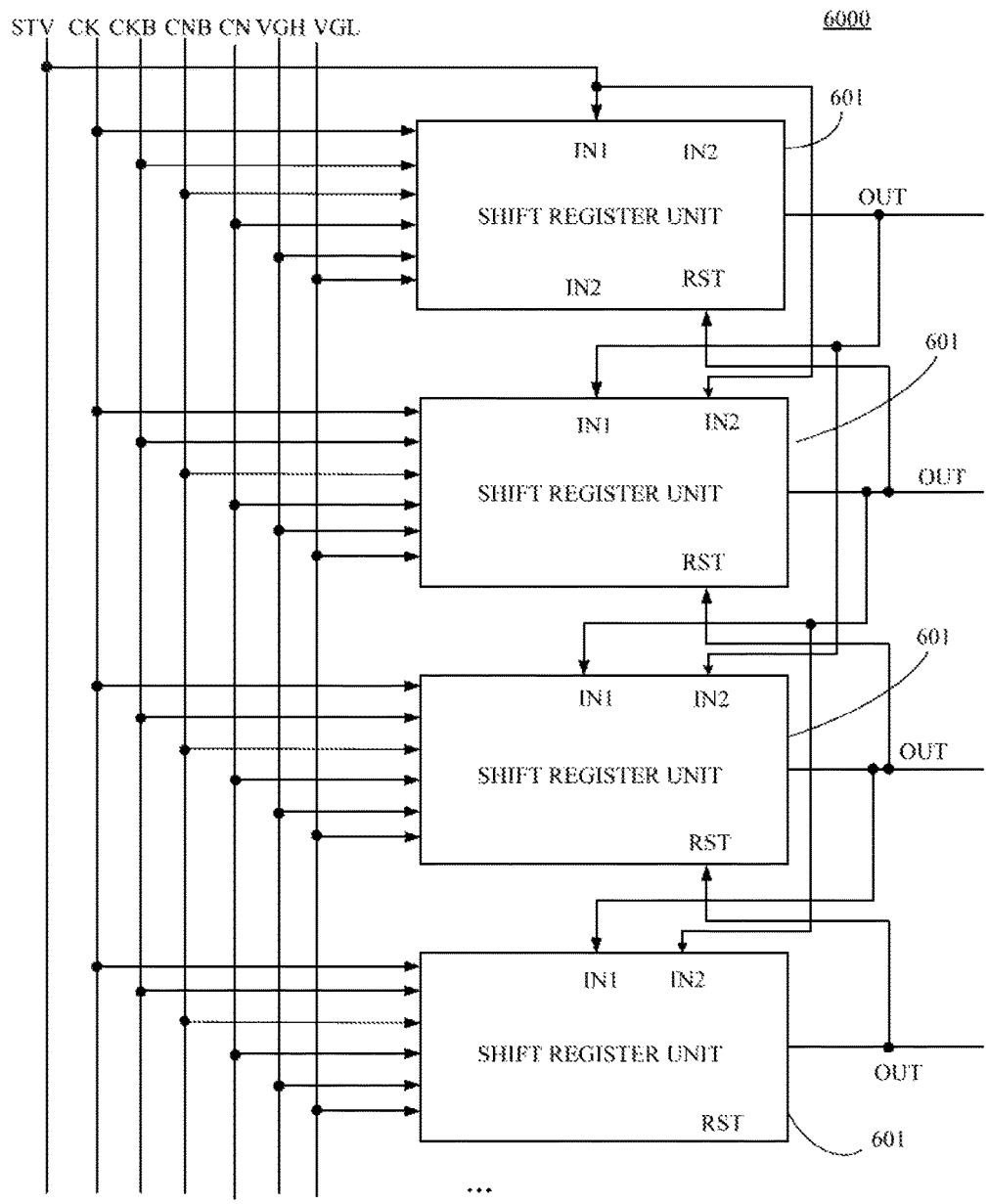
FIG. 6 illustrates a schematic view of an exemplary gate driving circuit according to various disclosed embodiments of the present disclosure.

The present disclosure further provides a gate driving circuit. FIG. 6 illustrates a schematic view of an exemplary gate driving circuit 6000 according to various disclosed embodiments of the present disclosure. As shown in FIG. 6, the gate driving circuit 6000 includes at least two cascaded shift register units 601, where each shift register unit 601 can include a shift register unit consistent with embodiments of the disclosure, such as one of the exemplary shift register units described above in connection with FIGS. 1-3.

As shown in FIG. 6, the input signal terminal IN1 of each shift register unit 601 is coupled to the output terminal OUT of the upper-one-stage shift register unit 601. The reset signal terminal RST of each shift register unit 601 is coupled to the output terminal OUT of the lower-one-stage shift register unit 601. The pre-reset signal terminal IN2 of each shift register unit 601 is coupled to the input signal terminal IN1 of the upper-one-stage shift register unit 601, which is also coupled to the output terminal OUT of an upper-two-stage shift register unit 601, i.e., a shift register unit 601 that is two stages before the current shift register unit 601. In addition, as shown in FIG. 6, the input signal terminal IN1 of the first-stage shift register unit 601, i.e., the shift register unit 601 without any upper stage shift register unit 601, of the gate driving circuit 6000 is coupled to a start vertical signal terminal STV. The pre-reset signal terminal IN2 of the first-stage shift register unit 601 may be coupled to the input signal terminal IN1 of the last-stage shift register unit 601 (not shown in FIG. 6 and thus the coupling is also not shown).

In addition, in the gate driving circuit shown in FIG. 6, the clock signals from the first clock signal terminal CK and the second clock signal terminal CKB are complementary signals. That is, the clock signals from the first clock signal terminal CK and the second clock signal terminal CKB have a same frequency and opposite phases. The first power supply signal terminal VGH may be used for providing a DC high level signal, and the second power supply signal terminal VGL may be used for providing a DC low level signal. The first control signal terminal CN and the second control signal terminal CNB may be forward and backward scan control signal terminals. If the first control signal terminal CN provides a first control signal at the first electric potential and the second control signal terminal CNB provides a second control signal at the second electric potential, the shift register units 601 in the gate driving circuit may start sequentially from the first-stage shift register unit 601, thereby realizing a forward scan of the display device. If the first control signal terminal CN provides a first control signal at the second electric potential and the second control signal terminal CNB provides a second control signal at the first electric potential, the shift register units 601 in the gate driving circuit may start sequentially from the last-stage shift register unit 601, thereby realizing a backward scan of the display device.

Figure 7:
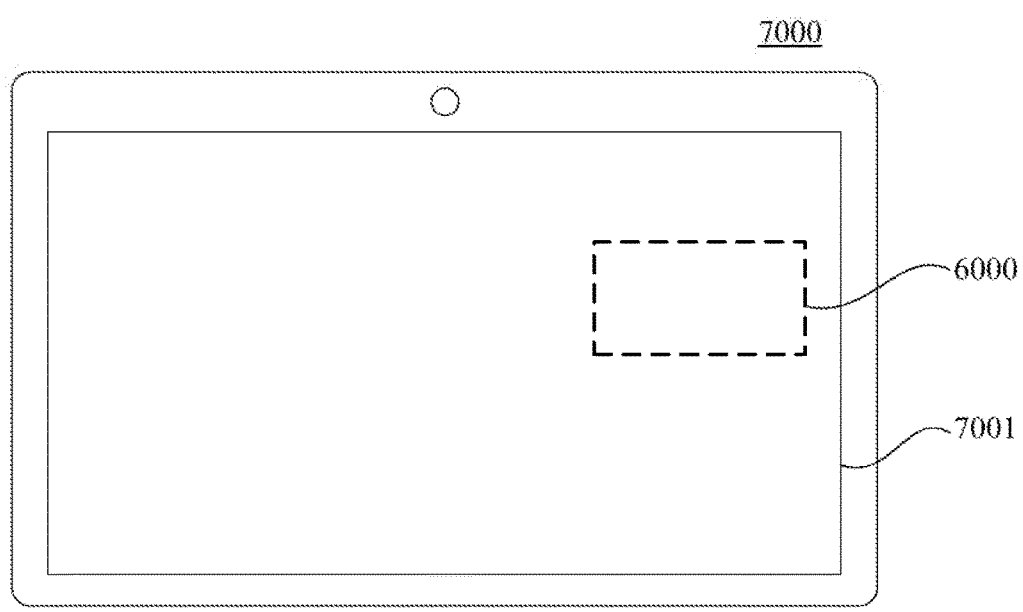
FIG. 7 illustrates a schematic view of an exemplary display device according to various disclosed embodiments of the present disclosure.

The present disclosure further provides a display device. FIG. 7 illustrates a schematic view of an exemplary display device 7000 according to various disclosed embodiments of the present disclosure. The display device 7000 shown in FIG. 7 includes the gate driving circuit 6000 as shown in FIG. 6 consistent with the disclosure. The gate driving circuit 6000 includes at least two cascaded shift register units consistent with embodiments of the disclosure, such as at least two of the exemplary shift register units described above in connection with FIGS. 1-3. In addition to gate driving circuit 6000, the display device 7000 may further include other suitable structures. For example, as shown in FIG. 7, the display device 7000 includes a display panel 7001 which further includes the gate driving circuit 6000 consistent with the disclosure.

The display device 7000 can be, for example, a liquid crystal panel, an electronic paper, an organic light-emitting diode (OLED) panel, an active-matrix organic light-emitting diode (AMOLED) panel, a mobile phone, a tablet computer, a television, a monitor, a notebook computer, a digital photo frame, a navigating instrument, or any other suitable product or component having a display function. Any display device including a gate driving circuit consistent with the disclosure is within the scope of the present disclosure.

The operation processes of the shift register units and modules are similar to the exemplary methods described above, and thus detailed description thereof is omitted.

The present disclosure provides a shift register unit, a driving method thereof, a gate driving circuit and a display device. The shift register unit may include an input module, an output module, a pull-down control module and a pull-down module. The pull-down control module may be coupled to a first power supply signal terminal, and transmit a first power supply signal to the pull-down node under the control of the first power supply signal terminal. Because the electric potential of the first power supply signal can remain at a first electric potential continuously, the electric potential of the pull-down node can be kept stable, ensuring that the pull-down module can continuously reduce the noise of the pull-up node and the output terminal under the control of the pull-down node. Accordingly, the noise reduction performance of the pull-down module can be improved.

The foregoing description of the embodiments of the disclosure has been presented for purposes of illustration and description. It is not intended to be exhaustive or to limit the disclosure to the precise form or to exemplary embodiments disclosed. Accordingly, the foregoing description should be regarded as illustrative rather than restrictive. Obviously, many modifications and variations will be apparent to persons skilled in this art. The embodiments are chosen and described in order to explain the principles of the technology, with various modifications suitable to the particular use or implementation contemplated. It is intended that the scope of the invention be defined by the claims appended hereto and their equivalents in which all terms are meant in their broadest reasonable sense unless otherwise indicated. Therefore, the term "the disclosure," "the present disclosure" or the like does not necessarily limit the claim scope to a specific embodiment, and the reference to exemplary embodiments of the disclosure does not imply a limitation on the invention, and no such limitation is to be inferred. Moreover, the claims may refer to "first", "second", etc. followed by a noun or element. Such terms should be understood as a nomenclature and should not be construed as giving the limitation on the number of the elements modified by such nomenclature unless specific number has been given. Any advantages and benefits described may or may not apply to all embodiments of the disclosure. It should be appreciated that variations may be made to the embodiments described by persons skilled in the art without departing from the scope of the present disclosure. Moreover, no element or component in the present disclosure is intended to be dedicated to the public regardless of whether the element or component is explicitly recited in the following claims.

What is claimed is:

1. A shift register unit comprising:
   an input circuit coupled to an input signal terminal, a reset signal terminal, a first control signal terminal, a second control signal terminal, and a pull-up node, the input circuit being configured to control an electric potential of the pull-up node under a control of an input signal from the input signal terminal, a reset signal from the reset signal terminal, a first control signal from the first control signal terminal, and a second control signal from the second control signal terminal;
   an output circuit coupled to a first clock signal terminal, the pull-up node, and an output terminal, the output circuit being configured to transmit a first clock signal from the first clock signal terminal to the output terminal under a control of the pull-up node;
   a pull-down control circuit coupled to a first power supply signal terminal, a second power supply signal terminal, the pull-up node, a pull-down node, and the reset signal terminal, the pull-down control circuit being configured to:
      transmit a first power supply signal from the first power supply signal terminal to the pull-down node under a control of the first power supply signal,
      transmit the first power supply signal from the first power supply signal terminal to the pull-down node under a control of the reset signal, and
      transmit a second power supply signal from the second power supply signal terminal to the pull-down node under a control of the pull-up node,
      wherein the first power supply signal is at a first electric potential, and the second power supply signal is at a second electric potential; and
   a pull-down circuit coupled to the pull-down node, the second power supply signal terminal, the pull-up node, and the output terminal, the pull-down circuit being configured to transmit the second power supply signal to the pull-up node and the output terminal under a control of the pull-down node.

2. The shift register unit according to claim 1, wherein:
   the pull-down control circuit includes a first pull-down control sub-circuit, a second pull-down control sub-circuit, a third pull-down control sub-circuit, a fourth pull-down control sub-circuit, a fifth pull-down control sub-circuit, and a sixth pull-down control sub-circuit; and
   the input circuit includes a first input sub-circuit and a second input sub-circuit.

3. The shift register unit according to claim 1, further comprising:
   a pre-reset circuit coupled to a pre-reset signal terminal, the second power supply signal terminal, the pull-up node, and the pull-down node, the pre-reset circuit being configured to transmit the second power supply signal to the pull-up node and the pre-reset signal to the pull-down node, under a control of a pre-reset signal from the pre-reset signal terminal.

4. The shift register unit according to claim 2, wherein the first pull-down control sub-circuit includes:
   a first transistor, a gate electrode and a first electrode of the first transistor being coupled to the first power supply signal terminal;
   a second transistor, a gate electrode of the second transistor being coupled to the first power supply signal terminal, a first electrode of the second transistor being coupled to a second electrode of the first transistor, and a second electrode of the second transistor being coupled to the pull-down node; and
   a third transistor, a gate electrode of the third transistor being coupled to the pull-up node, a first electrode of the third transistor being coupled to the second power supply signal terminal, and a second electrode of the third transistor being coupled to the pull-down node.

5. The shift register unit according to claim 4, wherein:
   the pull-down control circuit is further coupled to a second clock signal terminal and the output terminal,
   the second pull-down control sub-circuit includes a fourth transistor, a gate electrode and a first electrode of the fourth transistor being coupled to the second clock signal terminal, and a second electrode of the fourth transistor being coupled to the pull-down node,
   the fifth pull-down control sub-circuit includes a fifth transistor, a gate electrode of the fifth transistor being coupled to the output terminal, a first electrode of the fifth transistor being coupled to the second power supply signal terminal, and a second electrode of the fifth transistor being coupled to the pull-down node,
   the fourth pull-down control sub-circuit includes a sixth transistor, a gate electrode of the sixth transistor being coupled to the pull-up node, a first electrode of the sixth transistor being coupled to the second power supply signal terminal, and a second electrode of the sixth transistor being coupled to the pull-down node, and
   the sixth pull-down control sub-circuit includes a first capacitor, a first end of the first capacitor being coupled to the second power supply signal terminal, and a second end of the first capacitor being coupled to the pull-down node.

6. The shift register unit according to claim 3, wherein the pre-reset circuit includes:
   a seventh transistor, a gate electrode of the seventh transistor being coupled to the pre-reset signal terminal, a first electrode of the seventh transistor being coupled to the second power supply signal terminal, and a second electrode of the seventh transistor being coupled to the pull-up node; and
   an eighth transistor, a gate electrode and a first electrode of the eighth transistor being coupled to the pre-reset signal terminal, and a second electrode of the eighth transistor being coupled to the pull-down node.

7. The shift register unit according to claim 2, wherein the first input sub-circuit includes:
   a ninth transistor, a gate electrode of the ninth transistor being coupled to the input signal terminal, a first electrode of the ninth transistor being coupled to the first control signal terminal, and a second electrode of the ninth transistor being coupled to the pull-up node; and a tenth transistor, a gate electrode of the tenth transistor being coupled to the reset signal terminal, a first electrode of the tenth transistor being coupled to the second control signal terminal, and a second electrode of the tenth transistor being coupled to the pull-up node.

8. The shift register unit according to claim 2, wherein:
the third pull-down control sub-circuit includes an eleventh transistor,
a gate electrode of the eleventh transistor being coupled to the reset signal terminal, a first electrode of the eleventh transistor being coupled to the first power supply signal terminal, and a second electrode of the eleventh transistor being coupled to the pull-down node.

9. The shift register unit according to claim 7, wherein:
the input circuit is further coupled to the first power supply signal terminal; and
the second input sub-circuit includes a twelfth transistor, a gate electrode of the twelfth transistor being coupled to the first power supply signal terminal, a first electrode of the twelfth transistor being coupled to the second electrode of the ninth transistor and the second electrode of the tenth transistor, and a second electrode of the twelfth transistor being coupled to the pull-up node.

10. The shift register unit according to claim 1, wherein the output circuit includes:
a thirteenth transistor, a gate electrode of the thirteenth transistor being coupled to the pull-up node, a first electrode of the thirteenth transistor being coupled to the first clock signal terminal;
a fourteenth transistor, a gate electrode of the fourteenth transistor being coupled to the pull-up node, a first electrode of the fourteenth transistor being coupled to a second electrode of the thirteenth transistor, and a second electrode of the fourteenth transistor being coupled to the output terminal; and
a second capacitor, a first end of the second capacitor being coupled to the pull-up node, and a second end of the second capacitor being coupled to the output terminal.

11. The shift register unit according to claim 10, wherein the output circuit further includes:
a third capacitor, a first end of the third capacitor being coupled to the second power supply signal terminal, and a second end of the third capacitor being coupled to the pull-up node.

12. The shift register unit according to claim 1, wherein the pull-down circuit includes:
a fifteenth transistor, a gate electrode of the fifteenth transistor being coupled to the pull-down node, a first electrode of the fifteenth transistor being coupled to the second power supply signal terminal, and a second electrode of the fifteenth transistor being coupled to the pull-up node; and
a sixteenth transistor, a gate electrode of the sixteenth transistor being coupled to the pull-down node, a first electrode of the fifteenth transistor being coupled to the second power supply signal terminal, and a second electrode of the fifteenth transistor being coupled to the output terminal.

13. The shift register unit according to claim 4, wherein:
the transistors are N-type transistors, and
the first electric potential is higher than the second electric potential.

14. The shift register unit according to claim 4, wherein:
the transistors are P-type transistors, and
the first electric potential is lower than the second electric potential.

15. A method for driving a shift register unit, comprising:
providing an input signal at an input signal terminal to cause an input circuit to transmit a first control signal from a first control signal terminal to a pull-up node, the input signal and the first control signal being at a first electric potential;
providing a first clock signal at a first clock signal terminal and holding the pull-up node at the first electric potential, to cause an output circuit to transmit the first clock signal from the first clock signal terminal to an output terminal, the first clock signal being at the first electric potential;
providing a reset signal at a reset signal terminal to cause the input circuit to transmit a second control signal from a second control signal terminal to the pull-up node and to cause a pull-down control circuit to transmit a first power supply signal from a first power supply signal terminal to a pull-down node, the reset signal being at the first electric potential and the second control signal being at a second electric potential; and
providing the first power supply signal at a first power supply signal terminal to cause the pull-down control circuit to transmit the first power supply signal to the pull-down node, and to cause a pull-down circuit to transmit a second power supply signal from a second power supply signal terminal to the pull-up node and the output terminal, the first power supply signal being at the first electric potential and the second power supply signal being at the second electric potential.

16. The method according to claim 15, further comprising:
providing a pre-reset signal at a pre-reset signal terminal to cause a pre-reset circuit to transmit the second power supply signal to the pull-up node and to transmit the pre-reset signal to the pull-down node, and to cause the pull-down circuit to transmit the second power supply signal to the pull-up node and the output terminal.

17. The method according to claim 15, wherein:
the first electric potential is higher than the second electric potential.

18. The method according to claim 15, wherein:
the first electric potential is lower than the second electric potential.

19. A gate driving circuit, comprising at least two cascaded shift register units according to claim 1.

20. A display device, comprising the gate driving circuit according to claim 19.

* * * * *